United States Patent
Xiao et al.

(10) Patent No.: US 11,177,323 B2
(45) Date of Patent: Nov. 16, 2021

(54) DISPLAY DEVICE AND MANUFACTURING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Feng Xiao, Beijing (CN); Haoqing Guo, Beijing (CN); Lixiang Yi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/632,963

(22) PCT Filed: Nov. 30, 2018

(86) PCT No.: PCT/CN2018/118700
§ 371 (c)(1),
(2) Date: Jan. 22, 2020

(87) PCT Pub. No.: WO2020/107448
PCT Pub. Date: Jun. 4, 2020

(65) Prior Publication Data
US 2021/0066397 A1     Mar. 4, 2021

(51) Int. Cl.
*G09G 5/00* (2006.01)
*H01L 27/32* (2006.01)
(Continued)

(52) U.S. Cl.
CPC .............. *H01L 27/32* (2013.01); *G06F 3/011* (2013.01); *G06F 3/0412* (2013.01)

(58) Field of Classification Search
CPC ..... G06F 3/011; G06F 3/0412; G06K 9/0004; G06K 9/209; G06K 9/2018; H01L 27/323;
(Continued)

(56) References Cited

U.S. PATENT DOCUMENTS 10,288,784 B2    5/2019    Wu et al.
10,579,855 B2    3/2020    Zeng et al.
(Continued)

FOREIGN PATENT DOCUMENTS

CN    106203026 A    12/2016
CN    107680988 A    2/2018
(Continued)

*Primary Examiner* — Jennifer T Nguyen
(74) *Attorney, Agent, or Firm* — Dilworth & Barrese, LLP.; Michael J. Musella, Esq.

(57) ABSTRACT

A display device and a manufacturing method thereof are provided. The display device includes a display panel and a photosensitive imaging device. The display panel includes a display side and a back side opposite to the display side, and the display panel further includes a filter layer disposed at the back side of the display panel. The photosensitive imaging device is stacked with the display panel and located at a side of the filter layer facing away from the display side, and the photosensitive imaging device is configured to detect a skin texture image of a user touching the display panel.

14 Claims, 5 Drawing Sheets

(51) Int. Cl.
*G06F 3/01* (2006.01)
*G06F 3/041* (2006.01)

(58) Field of Classification Search
CPC ............. H01L 27/3211; H01L 27/3234; H01L 27/3246; H01L 27/14623; H01L 27/14627
USPC ........................................................ 345/173
See application file for complete search history.

(56) References Cited

U.S. PATENT DOCUMENTS

| | | | |
|---|---|---|---|
| 10,838,221 B2* | 11/2020 | Hai | G02B 27/30 |
| 2010/0067757 A1 | 3/2010 | Arai et al. | |
| 2017/0109564 A1* | 4/2017 | Seo | G06K 9/00067 |
| 2019/0180072 A1* | 6/2019 | Fomani | G06K 9/00046 |
| 2019/0228204 A1* | 7/2019 | Park | G09G 3/22 |
| 2019/0370447 A1* | 12/2019 | Houck | G06F 1/1626 |
| 2020/0096686 A1* | 3/2020 | Cool | G06F 1/1637 |

FOREIGN PATENT DOCUMENTS

| | | |
|---|---|---|
| CN | 108565279 A | 9/2018 |
| CN | 105629363 A | 6/2019 |

* cited by examiner

DISPLAY DEVICE AND MANUFACTURING METHOD THEREOF

TECHNICAL FIELDS

The embodiments of the present disclosure relate to a display device and a manufacturing method thereof.

BACKGROUND

Fingerprint recognition technology is widely used in fields of security and smart attendance, such as fingerprint punch-in, etc., and with the maturity and convenience of the technology, the fingerprint recognition technology is gradually used in smart phone terminals, and becomes a basic configuration of smart phones. With the development of full screen technology, optical fingerprint recognition solutions have been developing rapidly. How to design and manufacture a more optimized display device structure is a focus issue in the related art.

SUMMARY

At least one embodiment of the present disclosure provides a display device, and the display device includes a display panel and a photosensitive imaging device, wherein the display panel includes a display side and a back side opposite to the display side, and the display panel further includes a filter layer disposed at the back side of the display panel, and the photosensitive imaging device is stacked with the display panel and located at a side of the filter layer facing away from the display side, and the photosensitive imaging device is configured to detect a skin texture image of a user touching the display panel.

For example, in the display device according to one embodiment of the present disclosure, the filter layer includes a substrate layer and a filtering function layer having a filtering function, and the substrate layer and the filtering function layer are stacked and combined with each other.

For example, in the display device according to one embodiment of the present disclosure, a projection of the photosensitive imaging device on the substrate layer is located within a projection of the filtering function layer on the substrate layer in a direction perpendicular to the display panel.

For example, in the display device according to one embodiment of the present disclosure, the filtering function layer includes one or more of an infrared light filtering function layer, an ultraviolet light filtering function layer, a visible light filtering function layer, and a far infrared light filtering function layer.

For example, in the display device according to one embodiment of the present disclosure, the photosensitive imaging device includes a prism film, and the prism film is disposed at a light incident side of the photosensitive imaging device.

For example, in the display device according to one embodiment of the present disclosure, the photosensitive imaging device is combined with the filter layer by the prism film, so that the photosensitive imaging device is stacked with the display panel and located at the side of the filter layer facing away from the display side.

For example, in the display device according to one embodiment of the present disclosure, the filter layer has the filtering function as a whole.

For example, in the display device according to one embodiment of the present disclosure, the display panel includes a pixel unit, the pixel unit includes a light-emitting device, and the display panel is configured to allow light emitted by the light-emitting device, in a case where the light-emitting device is working, to be reflected by a user skin touching the display panel, for skin texture image recognition.

At least one embodiment of the present disclosure provides a manufacturing method of a display device, and the manufacturing method includes: providing a display panel, the display panel including a display side and a back side opposite to the display side, and the display panel further including a filter layer disposed at the back side of the display panel, and providing a photosensitive imaging device, the photosensitive imaging device being sequentially stacked with the display panel and located at a side of the filter layer facing away from the display side, wherein the photosensitive imaging device is configured to detect a skin texture image of a user touching the display panel.

For example, in the manufacturing method of a display device according to one embodiment of the present disclosure, the filter layer includes a substrate layer and a filtering function layer having a filtering function, and the substrate layer and the filtering function layer are stacked and combined with each other.

For example, in the manufacturing method of a display device according to one embodiment of the present disclosure, the filtering function layer includes one or more of an infrared light filtering function layer, an ultraviolet light filtering function layer, a visible light filtering function layer, and a far infrared light filtering function layer.

For example, in the manufacturing method of a display device according to one embodiment of the present disclosure, the photosensitive imaging device includes a prism film, and the prism film is disposed at a light incident side of the photosensitive imaging device.

For example, in the manufacturing method of a display device according to one embodiment of the present disclosure, the photosensitive imaging device is combined with the filter layer by the prism film, so that the photosensitive imaging device is stacked with the display panel and located at the side of the filter layer facing away from the display side.

At least one embodiment of the present disclosure further provides a filter layer of forming a display device, and the filter layer has a filtering function.

For example, in the filter layer of forming the display device according to one embodiment of the present disclosure, the filter layer having a filtering function includes a substrate layer and a filtering function layer having a filtering function, which are stacked and combined with each other.

For example, in the filter layer of forming the display device according to one embodiment of the present disclosure, the filtering function layer includes one or more of an infrared light filtering function layer, an ultraviolet light filtering function layer, a visible light filtering function layer, and a far infrared light filtering function layer.

For example, in the filter layer of forming the display device according to one embodiment of the present disclosure, the filter layer has the filtering function as a whole.

At least one embodiment of the present disclosure further provides a manufacturing method of a filter layer having a filtering function, and the method includes: forming a filtering function layer on a first side of a substrate mother layer to obtain the filter layer having a filtering function. The manufacturing method of the filter layer may be used for manufacturing the filter layer used in the above display device For example, in the manufacturing method of the filter layer having the filtering function according to one embodiment of the present disclosure, the method further includes: before forming the filtering function layer on the first side of the substrate mother layer, removing a first release film on the first side of the substrate mother layer; and attaching a second release film on the first side of the substrate mother layer on which the filtering function layer is formed.

For example, in the manufacturing method of the filter layer having the filtering function according to one embodiment of the present disclosure, the method further includes: before forming the filtering function layer on the first side of the substrate mother layer, performing an ion cleaning processing on the first side of the substrate mother layer from which the first release film is removed.

For example, in the manufacturing method of the filter layer having the filtering function according to one embodiment of the present disclosure, forming the filtering function layer on the first side of the substrate mother layer includes: depositing the filtering function layer or attaching the filtering function layer on the first side of the substrate mother layer.

For example, in the manufacturing method of the filter layer having the filtering function according to one embodiment of the present disclosure, the filtering function layer includes at least one film layer group, each film layer group includes a plurality of film layers, and forming the filtering function layer further includes: sequentially forming the plurality of film layers of the at least one film layer group.

For example, in the manufacturing method of the filter layer having the filtering function according to one embodiment of the present disclosure, the filtering function layer includes a first reflection film layer group, and the first reflection film layer group includes at least one film layer having a first refractive index and at least one film layer having a second refractive index, which are disposed at intervals, and the first refractive index is greater than the second refractive index.

For example, in the manufacturing method of the filter layer having the filtering function according to one embodiment of the present disclosure, the filtering function layer further includes a spacer film layer group and a second reflection film layer group, the first reflection film layer group, the spacer film layer group, and the second reflection film layer group are sequentially stacked on the first side of the substrate mother layer, and the second reflection film layer group includes at least one film layer having the first refractive index and at least one film layer having the second refractive index, and the spacer film layer includes a plurality of film layers with a same refractive index.

For example, in the manufacturing method of the filter layer having the filtering function according to one embodiment of the present disclosure, a material of the film layer having the first refractive index includes Ge or PbTe, and a material of the film layer having the second refractive index includes ZnS, ZnSe, $TiO_2$ or $SiO_2$.

For example, in the manufacturing method of the filter layer having the filtering function according to one embodiment of the present disclosure, a material thickness of the film layer having the first refractive index is 300 to 500 nanometers, and a material thickness of the film layer having the second refractive index is 1000 to 2000 nanometers.

For example, in the manufacturing method of the filter layer having the filtering function according to one embodiment of the present disclosure, the first refractive index is 4 to 6, and the second refractive index is 1.3 to 2.3.

BRIEF DESCRIPTION OF THE DRAWINGS

In order to clearly illustrate the technical solution of the embodiments of the present disclosure, the drawings of the embodiments will be briefly described in the following; it is obvious that the following described drawings are only related to some embodiments of the present disclosure, and thus are not limitative of the present disclosure.

DETAILED DESCRIPTION

In order to make objects, technical solutions and advantages of the embodiments of the present disclosure apparent, the technical solutions of the embodiments of the present disclosure will be described in a clearly and fully understandable way in connection with the accompanying drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Further, the terms such as "a," "an," "the," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A display device with an optical fingerprint recognition solution includes a filtering function layer, a prism film, and a photosensitive imaging device which are sequentially stacked and attached to a back side of a display panel, light-emitting units of the display device are configured to emit light upward, and the light emitted by the light-emitting units is reflected back by a finger and is collected and imaged in the photosensitive imaging device after filtering out interference light by the filtering function layer. Because the reflectivity of the light on ridges of the finger is different from that of the light on valleys of the finger, fingerprint recognition can be realized, and an image comparison and algorithm processing, etc., may be performed in a processing chip integrated in the photosensitive imaging device or an external processing chip.

In the above display device, the filtering function layer, the prism film, and the photosensitive imaging device are required to be sequentially attached on the back side of the display panel, and there are many attaching processes between components. Moreover, in the case where the filtering function layer is attached on the prism film, due to insufficient sealing at edges, problems, such as light leakage and warpage, etc., of the filtering function layer may occur, which may make the fingerprint recognition invalid, make the assembly yield of each component not high, and make a reducible space of an overall thickness of a fingerprint recognition module (including the filtering function layer, the prism film, and the photosensitive imaging device) extremely limited.

At least one embodiment of the present disclosure provides a display device, and the display device includes a display panel and a photosensitive imaging device. The display panel includes a display side and a back side opposite to the display side, and the display panel further includes a filter layer disposed at the back side of the display panel. The photosensitive imaging device is stacked with the display panel and located at a side of the filter layer facing away from the display side, and the photosensitive imaging device is configured to detect a skin texture image of a user touching the display panel.

At least one embodiment of the present disclosure provides the display device and a manufacturing method of the display device, the display panel in the display device includes the filter layer having the filtering function, and the photosensitive imaging device is stacked with the display panel and located at the side of the filter layer facing away from the display side, which reduces attaching processes between components and improves the assembly yield of each component, and attaching the filtering function layer on the prism becomes unnecessary, thereby avoiding the problems, such as light leakage and warpage, etc., of the filtering function layer, which improves the accuracy of the fingerprint recognition, and because the filter layer has a filtering function, additionally attaching the filtering function layer on the fingerprint recognition module becomes unnecessary, thereby reducing the overall thickness of the fingerprint recognition module.

Hereinafter, the embodiments of the present disclosure will be described in detail with reference to the accompanying drawings. It should be noted that same or similar reference numerals in different drawings will be used to refer to the same elements that have been described.

Figure 1A:
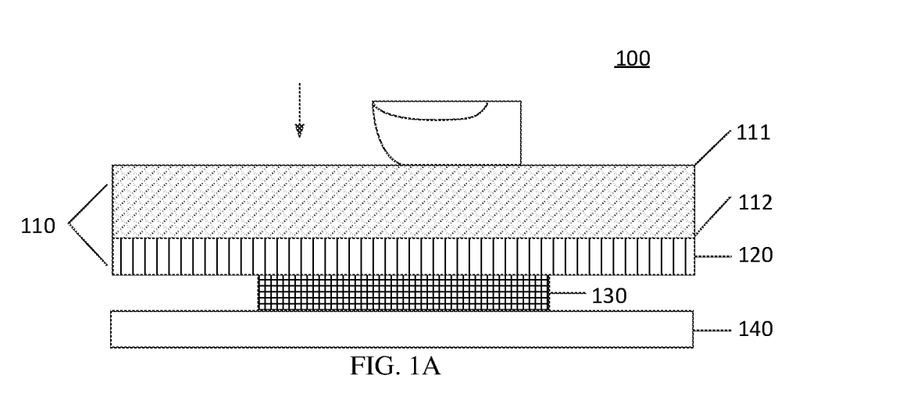
FIG. 1A is a schematic cross-sectional diagram of a display device according to some embodiments of the present disclosure.
Figure 1B:
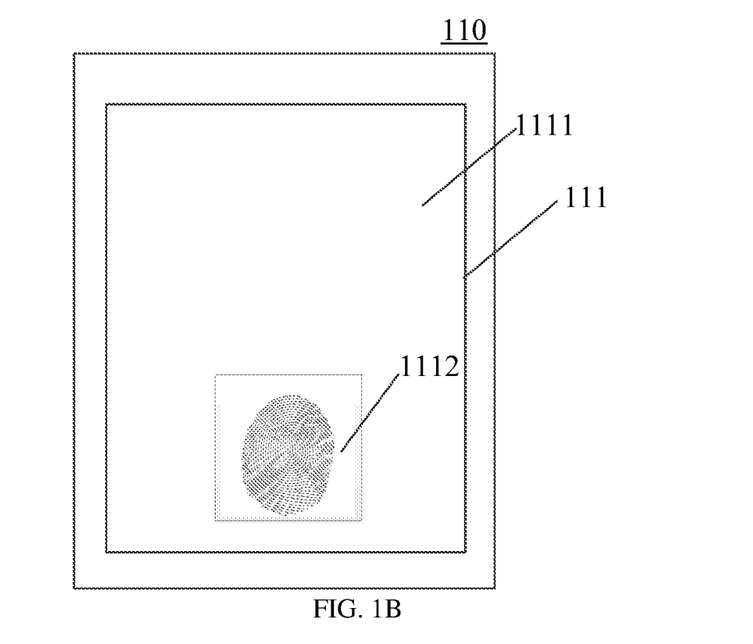
FIG. 1B is a schematic plan diagram of a display panel according to the embodiments.
Figure 1C:
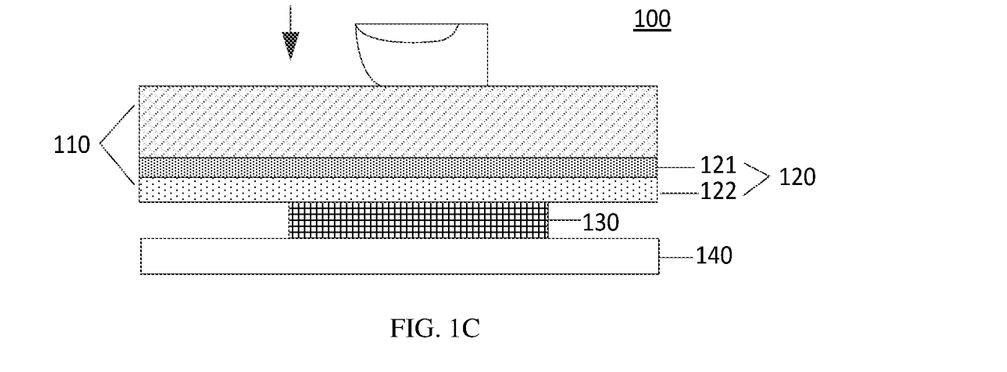
FIG. 1C is a schematic cross-sectional diagram of another display device according to the embodiments.
Figure 1D:
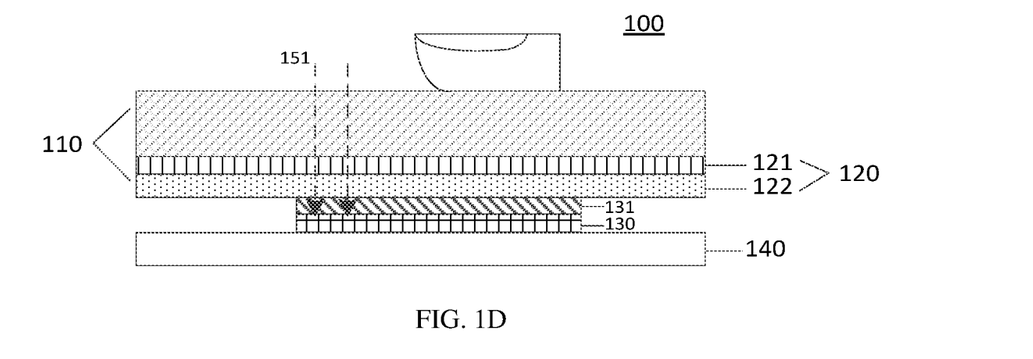
FIG. 1D is a schematic cross-sectional diagram of still another display device according to the embodiments.

FIG. 1A is a schematic cross-sectional diagram of a display device 100 according to some embodiments of the present disclosure; FIG. 1B is a schematic plan diagram of a display panel 110 according to the embodiments; FIG. 1C is a schematic cross-sectional diagram of another display device 100 according to the embodiments; and FIG. 1D is a schematic cross-sectional diagram of still another display device 100 according to the embodiments.

Referring to FIG. 1A and FIG. 1B, the display device 100 includes a display panel 110 and a photosensitive imaging device 130. The display panel 110 includes a display side 111 and a back side 112 opposite to the display side, and further includes a filter layer 120 disposed at the back side 112 of the display panel. The photosensitive imaging device 130 is stacked with the display panel 110 and located at a side of the filter layer 120 facing away from the display side 111. In addition, the display panel 110 and the photosensitive imaging device 130 are sequentially stacked, and the photosensitive imaging device 130 is located in a display area 1111 of the display panel 110 and located on the back side of the display panel 110. Therefore, the display device integrates a display function and an under-screen skin texture recognition function. For example, the filter layer functions as a bottom layer film (for example, a base substrate) of the display panel 110, that is, the display panel 110 has a bottom layer film with a filtering function, which filters out the interference light from the light incident on the display side during operations, so that the light reflected by the skin texture is collected and imaged on the photosensitive imaging device, thereby improving imaging quality and improving fingerprint recognition effect.

The display panel 110 may be an organic light-emitting diode (OLED) display panel, or may be an electronic paper display panel, which is not limited in the embodiments of the present disclosure. The OLED display panel may be, for example, a flexible OLED display panel. The OLED display panel has self-luminous characteristics, and the light emitted by the display pixel units of the OLED display panel can further be controlled or modulated as desired, thereby providing convenience for fingerprint image collection, and contributing to improve the integration level of the electronic device.

As shown in FIG. 1A and FIG. 1B, the display panel 110 includes the display side 111 having a display area 1111 and the back side 112 opposite to the display side. The display area 1111 includes a fingerprint recognition area 1112. The fingerprint recognition area 1112 may be part or all of the display area 1111, thereby realizing a partial under-screen fingerprint recognition function or a full under-screen fingerprint recognition function. The user can put his/her finger in the fingerprint recognition area 1112 or press upon the fingerprint recognition area 1112. When a light-emitting unit of the display device emits light, the light emitted by the light-emitting unit is reflected back by the finger, and is collected and imaged on the photosensitive imaging device 130. Then a fingerprint image obtained by the photosensitive imaging device 130 can be subsequently used for a fingerprint recognition operation.

The photosensitive imaging device 130 may be configured to collect skin texture images of a user, such as fingerprint images and palm print images, etc., and thus the skin texture images of the user may be used for realizing functions such as fingerprint recognition and palm print recognition, etc. The photosensitive imaging device 130 has a certain working area (an active area), and includes a plurality of pixel units that are arranged in a predetermined array. The photosensitive imaging device 130 is coupled to a processor (for example, an integrated circuit chip) by, for example, a lead(s), so that the collected fingerprint image may be transmitted to the processor in a data signal manner. The photosensitive imaging device 130 may be various suitable types of fingerprint sensors, such as a charge coupled device (CCD) type image sensor, a complementary metal oxide semiconductor (CMOS) type image sensor, etc. According to requirements, the photosensitive imaging device 130 may, for example, sense only light of a certain wavelength (for example, red light or green light), or may sense all visible light. The following specific example will be described by taking that the photosensitive imaging device 130 is configured as a fingerprint sensor for fingerprint recognition as an example.

As shown in FIG. 1A, the filter layer 120 having the filtering function is disposed between the photosensitive imaging device 130 and the back side of the display panel 110, and is configured to support the pixel unit array of the display panel 110. The pixel unit array may be directly manufactured on the filter layer 120. In this structure, when the display panel emits light, for example, the light-emitting device of the display panel 110 itself can be made to emit light, or an external light source (such as a backlight) can further be provided to enable the display panel 110 to emit light, after the finger reflects back the light emitted by the light panel 110, the interference light (such as infrared light) is filtered out by the filter layer 120 having the filtering function, so that the reflected light, which has been subjected to filtering, reaches the photosensitive imaging device 130, and is collected and imaged on the photosensitive imaging device 130. Then the fingerprint image obtained by the photosensitive imaging device 130 may be used for subsequent fingerprint recognition operations.

In this example, for example, the filter layer 120 having the filtering function is provided as the back side of the display panel 110, and the photosensitive imaging device 130 is attached to the back side (that is, a side opposite to the pixel unit array) of the filter layer 120 having the filtering function with a double-sided tape or an adhesive, so that the filter layer 120 and the photosensitive imaging device 130 are stacked on the back side of the display panel 110. Of course, the filter layer 120 and the photosensitive imaging device 130 may be fixed to each other in other ways.

In the above structure, the filter layer 120 having the filtering function is of a single body which is manufactured with the filtering function in advance, for example, the filter layer, which is of a single body, is formed by depositing the filtering function layer on a substrate mother layer in advance (the manufacturing process of the filter layer will be described in detail later). Because the filter layer has the filtering function as a whole, the process of attaching the filtering function layer on the prism can be omitted, and the thickness of the fingerprint recognition module and the thickness of the entire display device can be reduced.

In another example, as shown in FIG. 1C, the filter layer 120 having the filtering function may not be of a single body, which is manufactured with the filtering function in advance, but may include a substrate layer 121 and a filtering function layer 122 having the filtering function, which are stacked and attached with each other. In this example, the substrate layer 121 supports the pixel unit array of the display panel 110, the filtering function layer 122 may be attached to the substrate layer 121 by a double-sided tape or an adhesive, and the photosensitive imaging device 130 may be attached to the back side of the filtering function layer 122 by a double-sided tape or an adhesive, so that the substrate layer 121, the filtering function layer 122 and the photosensitive imaging device 130 are stacked on the back side of the display panel 110. Similarly, the substrate layer 121, the filtering function layer 122 having the filtering function, and the photosensitive imaging device 130 may be fixed to each other in other ways.

Please refer to FIG. 1C, in the direction perpendicular to the display panel 110, the filtering function layer 122 partially or completely covers the bottom of the substrate layer 121, and the projection of the photosensitive imaging device 130 on the substrate layer 121 is located within the projection of the filtering function layer 122 on the substrate layer 121. For example, the size of the projection of the filtering function layer 122 on the substrate layer 121 may be equal to the size of the substrate layer 121, for example, the filtering function layer 122 and the substrate layer 121 are obtained by the same cutting process as described below, and the size of the projection of the photosensitive imaging device 130 on the substrate layer 121 is smaller than the size of the substrate layer 121.

By attaching the filtering function layer on the substrate layer, and locating the projection of the photosensitive imaging device on the substrate layer within the projection of the filtering function layer on the substrate layer, problems of the filtering function layer, such as light leakage and warpage, etc., which are cause by the insufficient sealing at edges, in the case where the filtering function layer is attached on the prism, may be avoided. In the case where the problem of light leakage of the filtering function layer is alleviated, more stray light may be effectively filtered out, thereby further improving the accuracy of the fingerprint recognition.

Because infrared light has a strong penetrating ability and cannot form reflections at ridges and valleys of a finger, infrared light belongs to stray light and can reduce a signal-to-noise ratio and affect imaging quality. Therefore, in this example, the filtering function layer 122 may be an infrared light filtering function layer for filtering infrared stray light. Of course, the filtering function layer 122 may be implement in more than one way. For example, the filtering function layer 122 may include one or more of an infrared light filtering function layer, an ultraviolet light filtering function layer, a visible light filtering function layer, and a far infrared light filtering function layer. In different application scenarios, by setting the filtering function layer to filter out different types of stray light, the application scenarios of the embodiments of the present disclosure are more extensive.

In another example, as shown in FIG. 1D, the photosensitive imaging device 130 may include a prism film 131, and the prism film 131 is disposed at a light incident side 151 of the photosensitive imaging device 130. In this example, the photosensitive imaging device 130 is combined with the filter layer 120 by the prism film 131, for example, the filter layer 120 and the prism film 131 are combined by adhering to each other, so that the photosensitive imaging device 130 is stacked with the display panel 110 and located at the side of the filter layer 120 facing away from the display side 111.

In this exemplary structure, when the display panel emits light, for example, the light-emitting device of the display panel 110 itself can be made to emit light, or an external light source (such as a backlight) can further be provided to enable the display panel 110 to emit light, after the finger reflects back the light emitted by the light panel 110, the interference light is filtered out by the filter layer 120 having the filtering function, so that the reflected light, which has been subjected to the filtering, reaches the prism film 131, the prism film 131 brightens the filtered reflected light, and then the light that has been brightened is transmitted to the photosensitive imaging device 130 (for example, a sensor) for imaging. Then the fingerprint image obtained by the photosensitive imaging device 130 can be used for a subsequent fingerprint recognition operation.

In this example, the photosensitive imaging device 130 may be attached to a back side of the prism film 131 by a double-sided tape, and the prism film 131 may be attached to the back side of the filter layer 120 by a double-sided tape, so that the photosensitive imaging device 130, the prism film 131, and the filter layer 120 are stacked on the back side of the display panel 110. Similarly, the filter layer 120, the prism film 131, and the photosensitive imaging device 130 may be fixed to each other by other ways.

In some embodiments, the display device 100 further includes a back plate 140 which is configured to provide support and protection for the display device 100. For example, the stacked structure of the filter layer 120 and the photosensitive imaging device 130 may further directly or indirectly abut on the back plate 140, and may be relatively fixed on the back plate 140.

Of course, the structure of the display device 100 according to any of the embodiments of the present disclosure is not limited to the exemplary structures as shown in FIG. 1A-FIG. 1D. For example, the display device 100 may further include other devices, such as a driving chip, a memory, a microphone, a speaker, etc., which will not be described in detail here.

At least one embodiment of the present disclosure provides a display device, a display panel of the display device includes a filter layer having a filtering function, and a photosensitive imaging device is stacked with the display panel and located at a side of the filter layer facing away from the display side, which reduces attaching processes between components and therefore improves the assembly yield of each component. Moreover, in these embodiments, attaching the filtering function layer on the prism of the photosensitive imaging device becomes unnecessary, thereby avoiding problems, such as light leakage and warpage, etc., of the filtering function layer, and thereby improving the accuracy of the fingerprint recognition. In addition, because the filter layer has a filtering function, additionally attaching the filtering function layer on the fingerprint recognition module is not necessary, thereby reducing the overall thickness of the fingerprint recognition module. For example, the filter layer functions as a bottom layer film of the display panel, and is disposed at the back side of the display panel.

Figure 2:
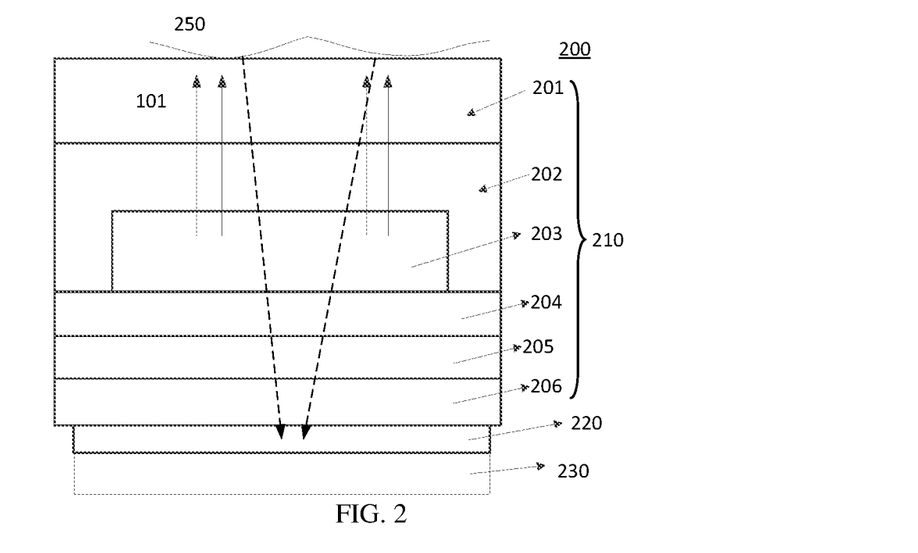
FIG. 2 is a schematic cross-sectional diagram of another display device according to some embodiments of the present disclosure.

FIG. 2 is a schematic cross-sectional diagram of another display device 200 according to some embodiments of the present disclosure. Referring to the embodiment of FIG. 2, the display device 200 includes a display panel 210 and a photosensitive imaging device 230. In the present embodiment, the display panel 210 is an OLED display panel.

As shown in FIG. 2, the OLED display panel 210 includes a top film 201, a thin film package 202, a pixel unit array 203, a flexible substrate 204, a filtering function layer 205, and a bottom layer film 206, etc. In the display panel, the stack of the filtering function layer 205 and the bottom layer film 206, as a whole, provides a filter layer having a filtering function, and functions as a bottom layer film of the display panel, which is located on a back side of the display panel, specifically, which is a side opposite to the pixel unit array 203 on the flexible substrate 204.

The bottom layer film 206 provides a protection and support function for other structures and functional layers thereon, and the bottom layer film 206 may be, for example, a stronger plastic substrate or a plastic substrate or a glass substrate with a higher strength. The filtering function layer 205 is located on the bottom layer film 206 for filtering out the stray light. The filtering function layer 205 may include one or more of an infrared light filtering function layer, an ultraviolet light filtering function layer, a visible light filtering function layer, and a far infrared light filtering function layer. The flexible substrate 204 is configured to provide a buffer, such as a flexible substrate made of a material such as polyimide (PI), polypropylene (PP), polycarbonate (PC), etc.

The pixel unit array 203 is formed on the flexible substrate 204, and includes a plurality of pixel units arranged in a predetermined array and signal lines (including gate lines, data lines, detection lines, etc.) for providing electrical signals (including scanning signals, data signals, detection signals, etc.). Each pixel unit includes a light-emitting device (for example, an OLED device) and a pixel driving circuit for driving the light-emitting device (the OLED device) to emit light, etc. The pixel driving circuit is coupled to the signal line, so that the pixel driving circuit can receive a corresponding control signal and a driving voltage, and drive the light-emitting device to emit light as requirements, thereby performing functions such as display, touching sensing, or skin texture (such as fingerprint) recognition, etc. Light 101 emitted by the pixel units may be used for displaying, and also used as incident light for the under-screen fingerprint detection. Specifically, the light 101 emitted by the light-emitting devices in the pixel units, when the light-emitting device is working, is reflected by a user's skin (a finger or a palm) 250 on the display side of the display panel for the skin texture image recognition of the user.

The thin film package 202 covers the pixel unit array 203 to prevent outside water vapor from entering the pixel unit array 203 to cause aging or deterioration. The thin film package 202 may be a multilayer thin film package, for example, including a stacked inorganic insulating layer and an organic insulating layer, etc.

The top film 201 may be a cover plate, such as a substrate or a thick film made of glass or plastic, and is configure to provide support and protection, for example, for the user to perform operations such as touching, pressing, etc.

According to requirements, the OLED display panel 210 may further include other structures or functional layers. For example, the OLED display panel 210 may include a touch structure for realizing a touch function. The touch structure may be built in the pixel unit array 203, or formed on the top film, and the touch structure may be in, for example, a capacitive type, a resistive type, etc.

In order to realize the under-screen fingerprint detection function, the top film 201, the thin film package 202, the flexible substrate 204, the filtering function layer 205, and the bottom layer film 206, which are described above, are at least partially transparent. The light 101 (indicated by a solid arrow) emitted by the light-emitting device in the pixel unit, in a case where the light-emitting device is working, is reflected by the skin (a finger or a palm) 250 of the user on the display side of the display panel, and the reflected light (indicated by a dashed arrow) may be incident on the photosensitive imaging device 230, so that the photosensitive imaging device 230 may form an image, and the image, which is obtained, is used to implement subsequent fingerprint recognition operations. The photographic imaging device 230 may include a prism film 220, and the prism film 220 is disposed at a light incident side of the photosensitive imaging device 230. The photosensitive imaging device 230 is combined with the bottom layer film 206 by the prism film 220, so that the photosensitive imaging device 230 is stacked with the display panel 210, and disposed at a side of the bottom layer film 206 of the display panel facing the photosensitive imaging device 230. The light reflected by the skin (the finger or the palm) 250 of the user on the display side of the display panel is incident on the photosensitive imaging device 230 by the prism film 220.

In at least one embodiment of the present disclosure, in order to use the principle of pinhole imaging to improve the effect of the photosensitive imaging device 230, a pinhole(s) may further be formed in the layer structure as shown in FIG. 2 (for example, a pinhole layer including a pinhole(s) is provided separately), and the pinhole(s) corresponds to the photosensitive imaging device 230.

The display device according to at least one embodiment of the present disclosure reduces attaching processes between components and improves the assembly yield of each component.

Figure 3:
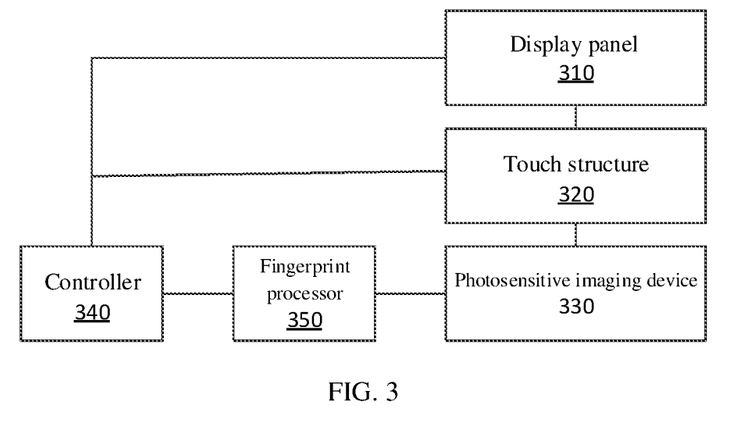
FIG. 3 is a block diagram of still another display device 300 according to some embodiments of the present disclosure.

FIG. 3 is a block diagram of still another display device 300 according to some embodiments of the present disclosure, the display device is, for example, a mobile phone or a tablet computer. As shown in FIG. 3, the display device 300 includes a display panel 310, a touch structure 320, a photosensitive imaging device 330, a controller 340 and a fingerprint processor 350. The ways to implement display panel 310 and the photosensitive imaging device 330 are the same as those of the display panel 110 and the photosensitive imaging device 130 in the above embodiments, and details are not described herein again. The touch structure 320 is coupled to the display panel 310, the photosensitive imaging device 330, and the controller 340, respectively. The controller 340 is coupled to the display panel 310, the touch structure 320, the photosensitive imaging device 330, and the fingerprint processor 350, respectively.

In some embodiments, when the touch structure 320 senses a user's pressing action on a display side of the display panel 310, the touch structure 320 transmits a feedback signal to the controller 340. The feedback signal may include information that the display panel 310 is pressed by a user, and may further include information such as a pressing degree (level), a pressing position, etc.

The controller 340 receives the feedback signal transmitted by the touch structure 320. The controller 340 controls the display panel 310 to emit light, that is, to light up the screen. Under this case, the controller 340 further controls the photosensitive imaging device 330 to start to collect a fingerprint image(s) and transmit the fingerprint image(s) to the fingerprint processor 350 for fingerprint recognition (and verification) of the user. After that, the fingerprint processor 350 transmits a recognition result to the controller 340, and the controller 340 performs subsequent (predetermined) operations according to the fingerprint recognition result. In a case where the controller 340 controls the display panel 310 to emit light to light up the screen, for example, a system of a mobile phone or a tablet is in a standby state, it is waited for a user to enter a password, etc., to unlock the system. Accordingly, in the case where the fingerprint recognition is successful, the controller 340 controls the system of the mobile phone or the tablet to enter into a working state, for example, an operation interface of an application before being in an off-screen state is displayed. The embodiments of the present disclosure are not limited thereto.

As a modified embodiment, the photosensitive imaging device 330 may transmit the fingerprint image imaged thereon to the controller 340, and the controller 340 transmits the user fingerprint image to the fingerprint processor 350, so that the fingerprint processor 350 completes the texture image recognition of the user. For example, if the texture recognition of the user is successful, the controller 340 releases a system lock state of an electronic device including the display device. If the texture recognition of the user or verification fails, the controller 340 controls the display panel 310 not to emit light, i.e., makes the display device 100 remain in the off-screen state.

In some embodiments of the present disclosure, the fingerprint processor may be implemented by a general-purpose processor or a special-purpose processor. The controller may be various types of integrated circuit chips with processing functions, which may have various computing architectures, such as a complex Instruction Set Computer (CISC) structure, a Reduced Instruction Set Computer (RISC) structure, or a structure that implements a combination of multiple instruction sets. In some embodiments, the controller may be a microprocessor, such as an X86 processor or an ARM processor, or may be a digital processor (DSP), etc.

Figure 4:
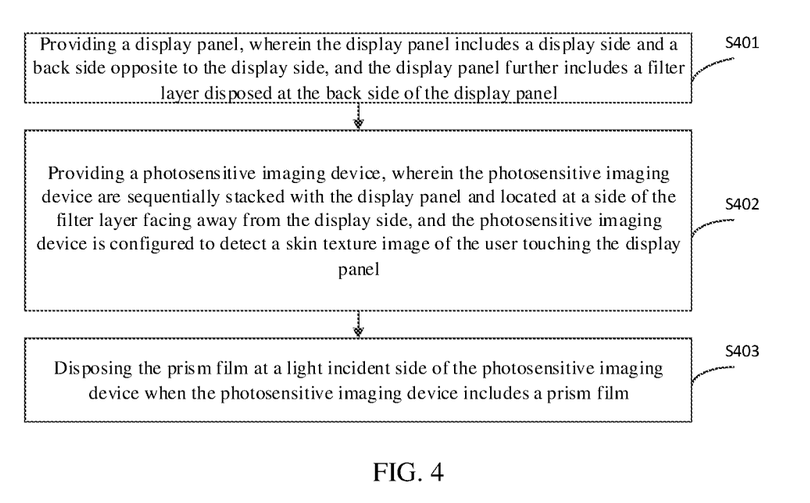
FIG. 4 is a schematic flowchart of a manufacturing method of a display device according to some embodiments of the present disclosure.

Other embodiments of the present disclosure provide a manufacturing method of the display device described above, and the manufacturing method and a working principle of the display device according to at least one embodiment of the present disclosure will be exemplarily described below with reference to FIG. 4.

At step S401, a display panel is provided, the display panel includes a display side and a back side opposite to the display side, and the display panel further includes a filter layer disposed at the back side of the display panel.

The display panel may be any display panel in the above embodiments, and details are not described herein again.

At step S402, a photosensitive imaging device is provided, the photosensitive imaging device are sequentially stacked with the display panel and located at a side of the filter layer facing away from the display side, and the photosensitive imaging device is configured to detect a skin texture image of the user touching the display panel.

The filter layer having the filtering function may be a filter layer as a single body, which is manufactured in advance, for example, it may be used as a bottom layer film of the display panel, that is, the filter layer as a whole has the filtering function, or may include a substrate layer and a filtering function layer having a filtering function, which are stacked and attached to each other. Further, for example, the filtering function layer may include one or more of an infrared light filtering function layer, an ultraviolet light filtering function layer, a visible light filtering function layer, and a far infrared light filtering function layer.

The photosensitive imaging device may include a prism film, and the method further includes step S403. The prism film is disposed at a light incident side of the photosensitive imaging device. The photosensitive imaging device may be combined with the filter layer by the prism film, so that the photosensitive imaging device is stacked with the display panel and located at the side of the filter layer facing away from the display side.

For the specific implementation process of the above steps may further refer to the description of the above embodiments of the display device, and details are not described herein again.

A manufacturing method of a display device according to at least one embodiment of the present disclosure may reduce attaching processes between components and improve the assembly yield of each component. And attaching a filtering function layer on the prism becomes unnecessary, thereby avoiding problems, such as light leakage and warpage, etc., of the filtering function layer, and thereby improving the accuracy of the fingerprint recognition. And because the filter layer has a filtering function, additionally attaching the filtering function layer on the fingerprint recognition module is not necessary, thereby reducing the overall thickness of the fingerprint recognition module.

Other embodiments of the present disclosure further provide a filter layer for forming a display device. The filter layer may be used in the display device in the above embodiments, and the filter layer has a filtering function.

The filter layer having the filtering function may be the filter layer having the filtering function as a whole, which is manufactured in advance, that is, the filter layer as a whole has the filtering function, or may include a substrate layer and the filtering function layer having the filtering function, which are stacked and attached with each other. Further, for example, the filtering function layer may include one or more of an infrared light filtering function layer, an ultraviolet light filtering function layer, a visible light filtering function layer, and a far infrared light filtering function layer.

The filter layer for forming the display device according to at least one embodiment of the present disclosure, in the case where the filter layer is used in the display device, attaching processes between components is reduced and the assembly yield of each component is improved. And attaching a filtering function layer on the prism is not necessary any more, thereby avoiding problems, such as light leakage and warpage, etc., of the filtering function layer, and thereby improving the accuracy of the fingerprint recognition. Because the filter layer has a filtering function, additionally attaching the filtering function layer on the fingerprint recognition module is not necessary, thereby reducing the overall thickness of the fingerprint recognition module.

Another embodiment of the present disclosure provides a manufacturing method of the filter layer having the filtering function, which is mentioned above, and the manufacturing method of the filter layer may be used for manufacturing the filter layer used in the display device, and the method includes: forming a filtering function layer on a first side of a substrate mother layer to obtain the filter layer having the filtering function.

Hereinafter, the manufacturing method and the working principle of the filter layer having the filtering function according to at least one embodiment of the present disclosure will be exemplarily described below with reference to FIG. 5.

At step S501, before forming a filtering function layer on the first side of the substrate mother layer, a first release film on the first side of the substrate mother layer is removed.

For example, the substrate mother layer may be a roll of PET (Polyethylene terephthalate), PMMA (poly (methyl methacrylate)), etc. In order to realize curling into the roll, a release film is usually attached to one or both sides of the substrate mother layer. In order to form the filtering function layer on the first side of the substrate mother layer, the first release film of the substrate mother layer is removed at first, which makes the filtering function layer be better attached to the substrate mother layer.

At step S502, before forming the filtering function layer on the first side of the substrate mother layer, an ion cleaning processing is performed on the first side of the substrate mother layer, from which the first release film is removed.

Performing the ion cleaning processing on the first side of the substrate mother layer may further remove organic objects (such as the previously used adhesive) attached to the surface of the first side, so that the filtering function layer may be better attached to the substrate mother layer.

At step S503, a filtering function layer is formed on the first side of the substrate mother layer to obtain the filter layer having the filtering function.

In the case where the light emitted from the display panel and reflected by user skin or light incident from outside may form stray light in a large viewing angle, which will affect a recognition result of the skin texture of the user by the photosensitive imaging device. Therefore, it is necessary to filter out the stray light by the filtering function layer.

There implementation methods of forming the filtering function layer on the first side of the substrate mother layer are many. For example, the filtering function layer may be formed by using a material having an adsorption effect on a certain type of light, or the filtering function layer may be formed by setting a film layer structure of the filtering function layer (for example, selecting refractive indexes of mediums on both sides of an interface on a light incident path to filter out stray light). For example, the filtering function layer may include at least one film layer group, each film layer group includes a plurality of film layers, and the filtering function layer is formed by sequentially forming the plurality of film layers of the at least one film layer group.

Figure 6:
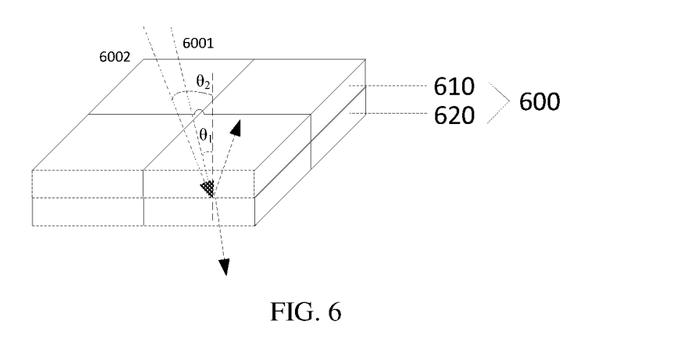
FIG. 6 is a schematic diagram of a layer structure of a filtering function layer according to some embodiments of the present disclosure.

FIG. 6 is a schematic diagram of a layer structure of a filtering function layer according to some embodiments of the present disclosure. Referring to FIG. 6, the filtering function layer includes a first reflection film layer group 600, the first reflection film layer group 600 includes a film layer 610 having a first refractive index and a film layer 620 having a second refractive index disposed at intervals, and the first refractive index is greater than the second refractive index. Of course, it can be understood that the first reflection film layer group 600 is not limited to the structure as shown in FIG. 6. For example, the first reflection film layer group 600 may include a plurality of (e.g., 1 to 10) film layers 610 having the first refractive index and a plurality of (e.g., 1 to 10) film layers 620 having the second refractive index.

In the present embodiment, filtering out the stray light may be implemented by controlling the film layers 610 having the first refractive index and the film layers 620 having the second refractive index in the first reflection film layer group 600. For example, filtering out the stray light may be implemented by selecting various first refractive indexes and various second refractive indexes. The first refractive index may be set to be 4 to 6, and the second refractive index may be set to be 1.3 to 2.3. Of course, the setting of the magnitudes of the first refractive index and the second refractive index is not limited to the above embodiments. As another example, filtering out the stray light may be implemented by selecting different materials for the film layer. The material of the film layer having the first refractive index may include Ge or PbTe, and the material of the film layer having the second refractive index may include ZnS, ZnSe, TiO2 or SiO2. Similarly, the selection of the materials of the film layer having the first refractive index and the selection of the materials of the film layer having the second refractive index are not limited thereto. Still for another example, filtering out the stray light may be implemented by setting different thicknesses of the materials of the film layer. The thickness of the material of the film layer having the first refractive index may be set to be 300 to 500 nanometers, and the thickness of the material of the film layer having the second refractive index may be set to be 1000 to 2000 nanometers. Similarly, the selection of the thickness of the film layer having the first refractive index and the selection of the thickness of the film layer having the second refractive index are not limited thereto.

The refractive index may be increased by the different settings of the film layers having the first refractive index and the film layers having the second refractive index, which is described above. For example, by setting of the above parameters, high transmittance (more than 90%) for visible light at 400 nm~630 nm and low transmittance (less than 5%) of infrared light at 700 nm~1100 nm may be achieved. In the case where the stray light is filtered out, effective light used for the photosensitive imaging device increases, thereby further improving the accuracy of the fingerprint recognition.

In this example, in the case where the incident angle of light 6001 incident from the display side of the display panel is smaller than a total reflection angle $\theta 1$, the light 6001, which is incident, may pass through the interface between the film layer 610 having the first refractive index of the first reflection film layer group 600 and the film layer 620 having the second refractive index of the first reflection film layer group 600, and further form an image on the photosensitive imaging device. In the case where the incident angle of light 6002 incident on the display side of the display panel is greater than $\theta 1$, because an incident angle $\theta 2$ of the light 6002 is greater than the total reflection angle $\theta 1$, the light 6002 is totally reflected at the interface between the film layer 610 having the first refractive index of the first reflection film layer group 600 and the film layer 620 having the second refractive index of the first reflection film layer group 600, and cannot reach the photosensitive imaging device to be imaged, thus realizing the filtering function of the filtering function layer by the principle of total reflection.

Figure 7A:
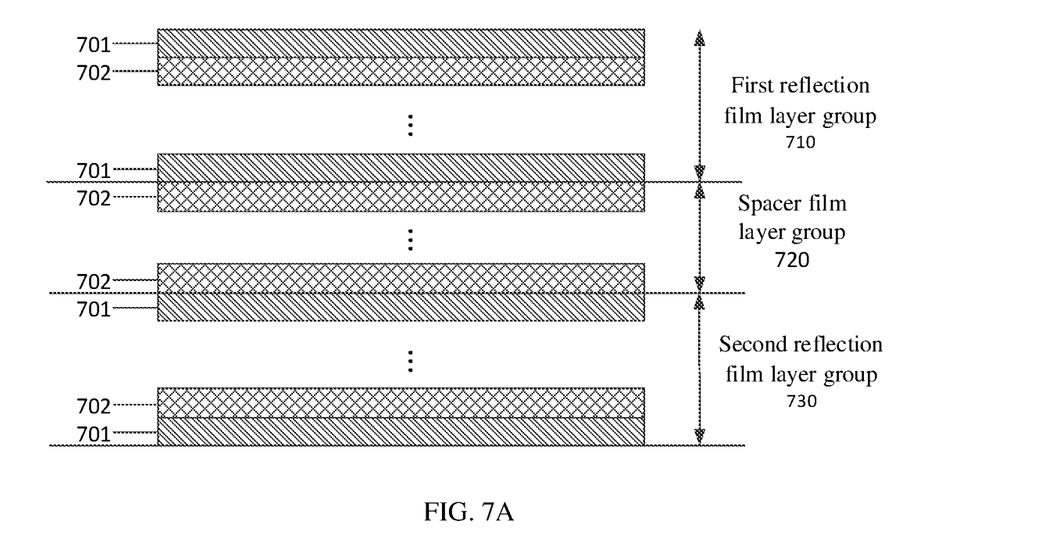
FIG. 7A is a schematic diagram of a layer structure of another filtering function layer according to some embodiments of the present disclosure.
Figure 7B:
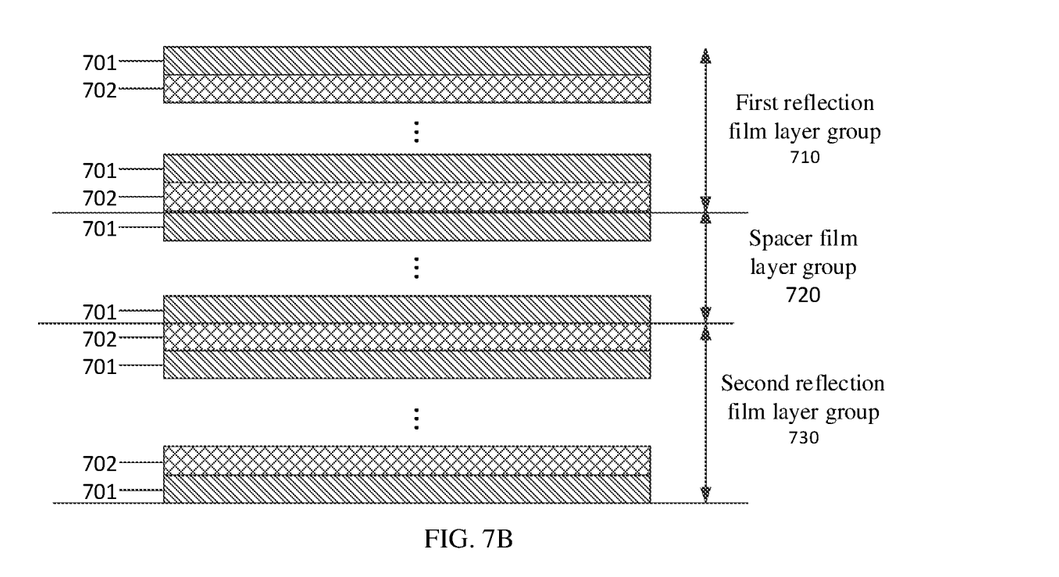
FIG. 7B is a schematic diagram of a layer structure of still another filtering function layer according to some embodiments of the present disclosure.

FIG. 7A and FIG. 7B is a schematic structure of a layer structure of a filtering function layer according to another embodiment of the present disclosure. Please refer to FIGS. 7A and 7B, the filtering function layer includes a first reflection film layer group 710, a spacer film layer group 720 and a second reflection film layer group 730. The first reflection film layer group 710, the spacer film layer group 720, and the second reflection film layer group 730 are sequentially stacked on the first side of the substrate mother layer The first reflection film layer group 710 and the second reflection film layer group 730 may include at least one film layer 701 having the first refractive index and at least one film layer 702 having the second refractive index. This setting is similar to the setting of the first reflection film layer group 600 in the previous embodiment, and details are not described herein again.

The spacer film layer 720 may include a plurality of film layers having a same refractive index, in the embodiment, the refractive index may be set to the first refractive index or the second refractive index. For example, as shown in FIG. 7A, a plurality of film layers 701 having the first refractive index may be included, or as shown in FIG. 7B, a plurality of film layers 702 having the second refractive index may be included. For related settings of the first refractive index and the second refractive index, reference may be made to the description of the corresponding embodiment of FIG. 6, and details are not described herein again. In addition, a number of film layers included in the spacer film layer 720 may be set as requirements, and for example, may include 1 to 10 layers.

In this example, in the case where the light incident on the display side of the display panel first reaches the first reflection film layer group, the stray light may be filtered out by the principle of the total reflection. If part of the stray light is still not filtered out and remains in the first reflective film group, the part of the stray light will produce a light trapping effect due to a structure formed by the first reflection film layer group and the spacer film layer group and a structure formed by the spacer film layer group and the second reflection film layer group, so that the part of stray light cannot reach the photosensitive imaging device to be imaged. The filter film with a multi-film layer group structure realizes the filtering function by the principle of the total reflection and the light trapping effect.

The filtering function layer, which is composed of multi-film layer group further enhances the filtering function. In the case where more stray light is filtered out, effective light reaching the photosensitive imaging device will increase, thereby further improving the accuracy of the fingerprint recognition.

Figure 5:
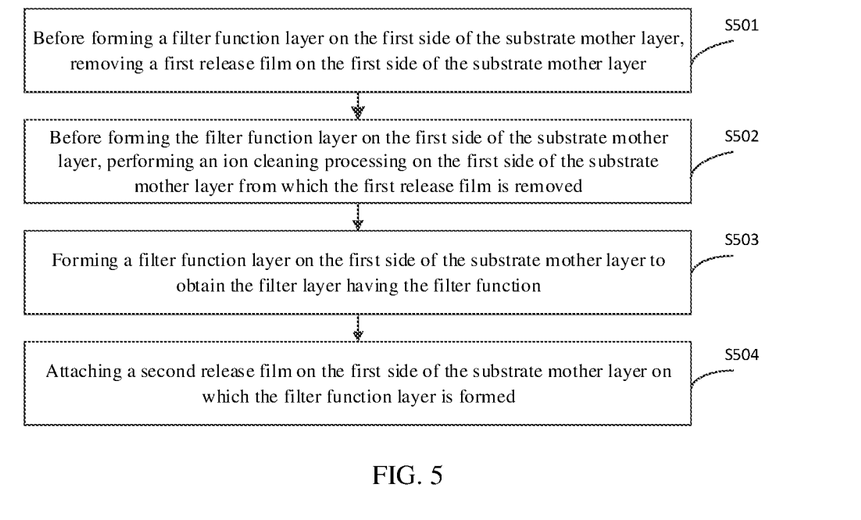
FIG. 5 is a schematic flowchart of a manufacturing method of a filter layer with a filtering function according to some embodiments of the present disclosure.

Further referring to FIG. 5, the method further includes step S504, attaching a second release film on the first side of the substrate mother layer on which the filtering function layer is formed to obtain the filter layer with the filtering function.

Therefore, after forming the filtering function layer, a release film may be attached to the first side surface of the substrate mother layer, and then the filter layer with the filtering function, which is obtained, may be curled into the roll, for storage and transportation, etc. The second release film is attached on the first side after forming the filtering function layer, which may prevent water, oxygen, and charged ions, and prolong service life of the filtering function layer.

After the filter layer having the filtering function is manufactured, the filter layer may be provided to a manufacturing factory of a display device. During a manufacturing process of the display panel, after removing the second release film on the surface of the filtering function layer of the filter layer having the filtering function, the second release film is cut to an appropriate size for forming a back side of the display panel and using as a bottom layer film of the display panel, which is configured to provide support and protection for the display panel. For example, after a pixel unit array is manufactured on a flexible substrate, the pixel unit array is peeled off as a whole, transferred onto the bottom layer film, and combined with the bottom layer film.

The manufacturing method of a filter layer of forming a display device according to at least one embodiment of the present disclosure, in the case where the manufacture method is used to manufacture a display device, reduces attaching processes between components and improves the assembly yield of each component. And attaching a filtering function layer on the prism is not necessary, thereby avoiding problems, such as light leakage and warpage, etc., of the filtering function layer, and thereby improving the accuracy of the fingerprint recognition. And because the filter layer has a filtering function, additionally attaching the filtering function layer on the fingerprint recognition module is not necessary any more, thereby reducing the overall thickness of the fingerprint recognition module.

The following statements should be noted:

(1) The accompanying drawings of the embodiments of the present disclosure involve only the structure(s) in connection with the embodiment(s) of the present disclosure, and other structure(s) can be referred to common design(s).

(2) In case of no conflict, features in one embodiment or in different embodiments can be combined.

What are described above is related to the specific implementations of the present disclosure only and not limitative to the protection scope of the disclosure. The protection scope of the present disclosure shall be subject to that of the claims.

What is claimed is:

1. A display device comprising:
a display panel and a photosensitive imaging device,
wherein the display panel comprises a display side and a back side opposite to the display side, and the display panel further comprises a filter layer disposed at the back side of the display panel, and
the photosensitive imaging device is stacked with the display panel and located at a side of the filter layer facing away from the display side, and the photosensitive imaging device is configured to detect a skin texture image of a user touching the display panel,
the photosensitive imaging device comprises a prism film, and the prism film is disposed between the photosensitive imaging device and the filter layer, and the photosensitive imaging device is attached to a back side of the prism film by a double-sided tape,
wherein the filter layer comprises a substrate layer and a filtering function layer having a filtering function, and the substrate layer and the filtering function layer are stacked and combined with each other, the filtering function layer comprises at least one film layer group, the filtering function layer comprises a first reflection film layer group, and the first reflection film layer group comprises at least one film layer having a first refractive index and at least one film layer having a second refractive index, which are disposed at intervals, and the first refractive index is greater than the second refractive index,
wherein the filtering function layer further comprises a spacer film layer group and a second reflection film layer group, the first reflection film layer group, the spacer film layer group, and the second reflection film layer group are sequentially stacked on the first side of the substrate mother layer, and
the second reflection film layer group comprises at least one film layer having the first refractive index and at least one film layer having the second refractive index, and the spacer film layer comprises a plurality of film layers which have a same refractive index and are stacked and attached with each other, all the spacer film layer group is disposed between the first reflection film layer group and the second reflection film layer group.

2. The display device according to claim 1, wherein a projection of the photosensitive imaging device on the substrate layer is located within a projection of the filtering function layer on the substrate layer in a direction perpendicular to the display panel.

3. The display device according to claim 1, wherein the filtering function layer comprises one or more selected from the group consisting of an infrared light filtering function layer, an ultraviolet light filtering function layer, a visible light filtering function layer, and a far infrared light filtering function layer.

4. The display device according to claim 1, wherein the photosensitive imaging device is combined with the filter layer by the prism film, so that the photosensitive imaging device is stacked with the display panel and located at the side of the filter layer facing away from the display side.

5. The display device according to claim 1, wherein the display panel comprises a pixel unit, the pixel unit comprises a light-emitting device, and
the display panel is configured to allow light emitted by the light-emitting device, in a case where the light-emitting device is working, to be reflected by a user skin touching the display panel, for skin texture image recognition.

6. A method of manufacturing the display device according to claim 1, comprising:
providing a display panel, the display panel comprising a display side and a back side opposite to the display side, and the display panel further comprising a filter layer disposed at the back side of the display panel, and
providing a photosensitive imaging device, the photosensitive imaging device being sequentially stacked with the display panel and located at a side of the filter layer facing away from the display side, wherein the photosensitive imaging device is configured to detect a skin texture image of a user touching the display panel,
wherein the photosensitive imaging device comprises a prism film, and the prism film is disposed between the photosensitive imaging device and the filter layer,
wherein the filtering function layer is formed on a first side of a substrate mother layer to obtain the filter layer, the filtering function layer comprises at least one film layer group, each film layer group comprises a plurality of film layers, and
forming the filtering function layer further comprises:
sequentially forming the plurality of film layers of the at least one film layer group,
the filtering function layer comprises the first reflection film layer group, and the first reflection film layer group comprises at least one film layer having the first refractive index and at least one film layer having the second refractive index, which are disposed at intervals, and the first refractive index is greater than the second refractive index,
wherein the filtering function layer further comprises the spacer film layer group and the second reflection film layer group, the first reflection film layer group, the spacer film layer group, and the second reflection film layer group are sequentially stacked on the first side of the substrate mother layer, and
the second reflection film layer group comprises at least one film layer having the first refractive index and at least one film layer having the second refractive index, and the spacer film layer comprises a plurality of film layers which have a same refractive index and are stacked and attached with each other, all the spacer film layer group is disposed between the first reflection film layer group and the second reflection film layer group.

7. The method according to claim 6, wherein the filter layer comprises a substrate layer and a filtering function layer having a filtering function, and the substrate layer and the filtering function layer are stacked and combined with each other.

8. The method according to claim 7, wherein the filtering function layer comprises one or more selected from the group consisting of an infrared light filtering function layer, an ultraviolet light filtering function layer, a visible light filtering function layer, and a far infrared light filtering function layer.

9. The method according to claim 6, wherein the photosensitive imaging device is combined with the filter layer by the prism film, so that the photosensitive imaging device is stacked with the display panel and located at the side of the filter layer facing away from the display side.

10. The method according to claim 6, wherein a filtering function layer is formed on a first side of a substrate mother layer to obtain the filter layer, the method further comprises:
before forming the filtering function layer on the first side of the substrate mother layer, removing a first release film on the first side of the substrate mother layer; and
attaching a second release film on the first side of the substrate mother layer on which the filtering function layer is formed.

11. The method according to claim 10, further comprising:
before forming the filtering function layer on the first side of the substrate mother layer, performing an ion cleaning processing on the first side of the substrate mother layer, from which the first release film is removed.

12. The method according to claim 6, wherein a filtering function layer is formed on a first side of a substrate mother layer to obtain the filter layer, forming the filtering function layer on the first side of the substrate mother layer comprises:

depositing the filtering function layer or attaching the filtering function layer on the first side of the substrate mother layer.

13. The method according to claim 6, wherein a material of the film layer having the first refractive index comprises Ge or PbTe, and a material of the film layer having the second refractive index comprises ZnS, ZnSe, TiO2 or SiO2;

the first refractive index is 4 to 6, and the second refractive index is 1.3 to 2.3.

14. The method according to claim 6, wherein a material thickness of the film layer having the first refractive index is 300 to 500 nanometers, and a material thickness of the film layer having the second refractive index is 1000 to 2000 nanometers.

* * * * *